United States Patent [19]
Ray

[11] Patent Number: 4,975,586
[45] Date of Patent: Dec. 4, 1990

[54] ION IMPLANTER END STATION

[75] Inventor: Andrew M. Ray, Austin, Tex.

[73] Assignee: Eaton Corporation, Cleveland, Ohio

[21] Appl. No.: 317,224

[22] Filed: Feb. 28, 1989

[51] Int. Cl.⁵ ............................................... G21K 5/08
[52] U.S. Cl. ................................ 250/492.2; 250/440.1; 250/441.1; 250/442.1
[58] Field of Search ............ 250/492.21, 442.2, 442.1, 250/440.1, 441.1

[56] References Cited

U.S. PATENT DOCUMENTS

| | | | |
|---|---|---|---|
| 3,629,577 | 12/1971 | Weber et al. | 250/442.1 |
| 4,234,797 | 11/1980 | Ryding | 250/492.21 |
| 4,405,864 | 9/1983 | del Rio | 250/492.21 |
| 4,508,056 | 4/1985 | Bruel et al. | 250/492.21 |
| 4,661,968 | 4/1987 | Wondergem | 250/442.1 |
| 4,672,210 | 6/1987 | Armstrong et al. | 250/492.21 |
| 4,733,087 | 3/1988 | Narita et al. | 250/492.21 |
| 4,745,287 | 5/1988 | Turner | 250/492.2 |
| 4,794,305 | 12/1988 | Matsukawa | 250/492.21 |
| 4,869,801 | 9/1989 | Helms et al. | 204/298 |

FOREIGN PATENT DOCUMENTS 68281248 12/1987 Japan.

OTHER PUBLICATIONS

Improved VLSI Device Yields Through Control of Implant Angle by R. E. Kaim and J. F. M. Westendorp.
Analysis of Uniformity of Trench Side-Wall Doping by SIMS by T. Takemoto, Y. Hirofuji, H. Iwasaki, N. Matsuo.
A New Isolation Method with Boron-Implanted Sidewalls for Controlling Narrow-Width Effect by G. Fuse, M. Fukumoto, A. Shinohara, S. Odanaka, M. Sasago, T. Ohzone.
New End Station for Rotation/Wide-Angle Ion Implanter Technique and Its Application to VLSI Devices, Nissin Electric Company, Ltd.

Primary Examiner—Jack I. Berman
Assistant Examiner—Kiet T. Nguyen
Attorney, Agent, or Firm—F. M. Sajovec

[57] ABSTRACT

An end station for an ion implanter which includes a wafer support which is rotatable about a first axis extending substantially along a wafer diameter in the plane defined by the wafer surface, and about a second axis perpendicular to the first axis and extending through the center of the wafer. The drive systems for providing rotation of the wafer support are operable independently of one another and include stepper motors mounted outside the vacuum chamber of the implanter.

12 Claims, 3 Drawing Sheets

ION IMPLANTER END STATION

The present invention relates generally to ion implantation equipment and more particularly to an improved end station for an ion implanter.

Ion implanters are well known in the art. U.S. Pat. No. 4,761,559 to Myron, and assigned to the assignee herein, depicts a typical ion implanter incorporating an end station wherein semiconductor wafers are transported serially into the end station vacuum chamber, clamped to a platen, rotated into a fixed implant position, and then implanted while held rigidly in the fixed position. Typically, this fixed position is at a predetermined angle of incidence, generally 7°, to avoid channeling effects.

There has recently been developed a need for improved versatility in ion implanter operation, specifically the ability to implant wafers at variable implant angles substantially higher than the typical 7° angle, and the ability to rotate the wafer during implantation. Some of the applications which require such versatility are large Angle Tilt Implanted Drain (LATID) transistors, trench capacitor sidewall for Dynamic Ram, Lightly Doped Drain (LDD) symmetry enhancement, channel stop trench sidewall implant, improved sheet resistance uniformity, and the reduction of shadowing effects from high aspect ratio masks. It is expected that other applications will become evident as the capability for performing these operations is incorporated in implanter designs.

Based on the above, it is an object of the present invention to provide an end station for an ion implanter which will enable wafers to be implanted at high implant or tilt angles, i.e. at least 60° between the beam and a line normal to the plane of the wafer surface.

Another object of the invention is to provide the capability for rotating the wafer during or between implants. This includes rotating the wafer continuously during implantation; as well as implanting the wafer at a given dose, rotating the wafer through a predetermined angle and then repeating the cycle one or more times.

It is a further object of the invention to achieve the above with an end station which is compatible with accepted low particulate wafer handling techniques. A typical technique includes loading and unloading of the wafer chuck in the same horizontal position. The invention must also be compatible with proven, existing wafer cooling systems, such as a gas conduction assisted cooling system of the type disclosed in U.S. Pat. No. 4,261,762 to King and assigned to the assignee herein.

A still further object of the invention is to provide an end station as above wherein the tilt axis is in the plane defined by the wafer surface, and both the tilt and rotation axes pass through the center of the wafer so that no vertical or horizontal translation of the wafer with respect to the scanned beam pattern occurs.

To meet the above objectives the present invention provides an end station for an ion implanter which includes a wafer support rotatable about a first axis to provide an angle of incidence with respect to the ion beam which is infinitely variable between 0° and 90°620 and about a second axis normal to the first axis to provide rotation of the wafer with respect to the beam. The first axis extends substantially along the flat surface of the wafer and both the first and second axes extend through the center of the wafer face so that there is no vertical or horizontal translation of the wafer with respect to the beam when the wafer is tilted or rotated. The wafer support is mounted on a first housing which is supported for rotation by a hub assembly extending through the wall of the end station vacuum chamber and is driven by a stepper motor through a drive belt and sheave system. Rotation of the support about its own axis is provided by a stepper motor mounted on the rotating housing and connected to the wafer support by means of a drive system within the housing such that the two drive systems are operable independently of each other.

Other objectives and advantages of the invention will be apparent from the following description when considered in connection with the accompanying drawings, wherein.

Figure 1:
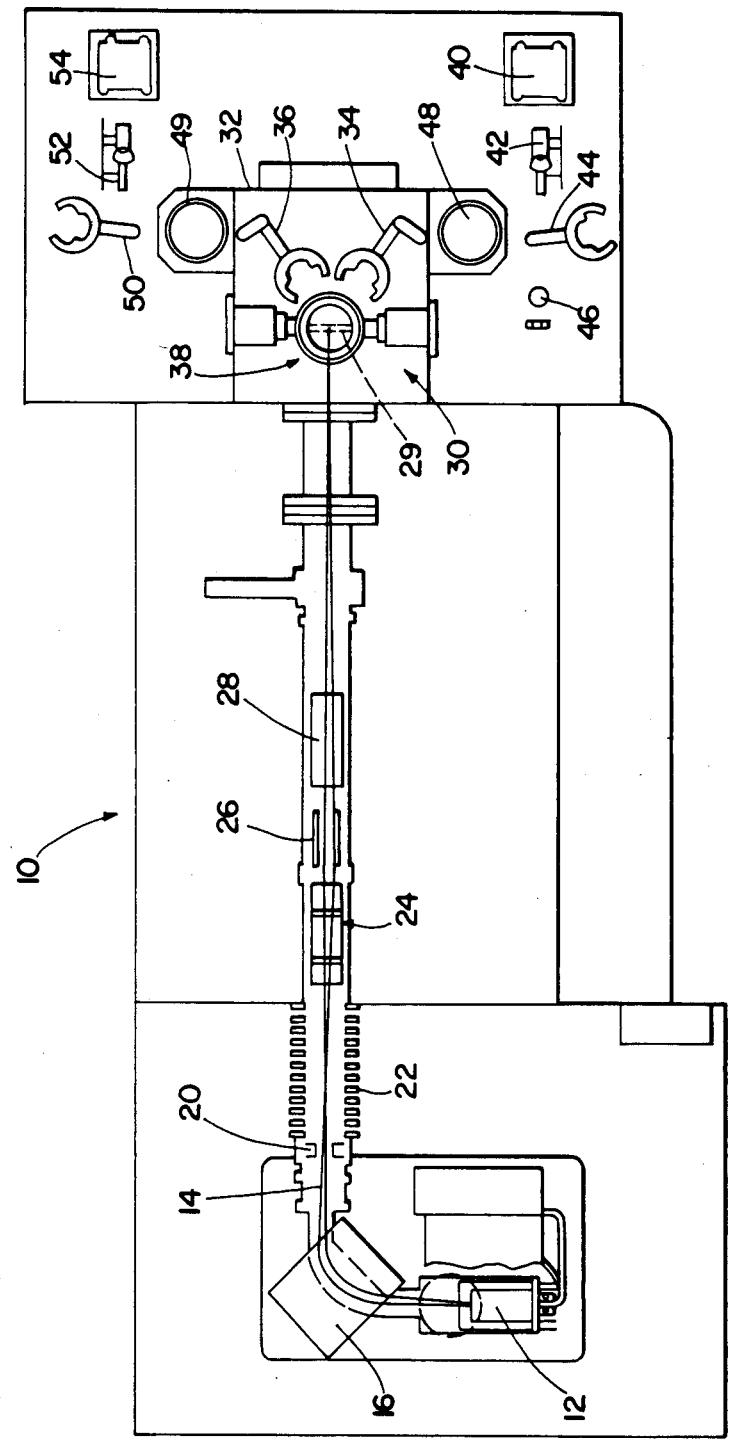
FIG. 1 is a schematic plan view of an ion implanter incorporating the invention.

Referring the FIG. 1, there is illustrated an ion implanter 10, having an ion source 12 for directing an ion beam 14 to an analyzing magnet 16 which bends the beam and directs it along an elongated travel path through a beam shutter 20 and accelerating electrodes 22. Subsequent to the electrodes 22, the beam passes through a quadrupole lens system 24 that focuses the beam, and then through deflection electrodes 26 and 28 wherein control voltages deflect the beam from side to side and up and down, the modulation of such control voltages causing the beam to be scanned across a wafer 29 positioned in an end station 30.

The end station 30 is located in an evacuated chamber 32. Two arms 34 and 36 mounted within the chamber 32 automatically load and unload wafers to and from a wafer support assembly 38 which moves between a loading position as illustrated in solid line and one or more implant positions which place the wafer in a position such as that indicated in broken line in FIG. 1. In a typical implant operation, undoped wafers are retrieved from a cassette 40 by a shuttle 42 which brings a wafer to the vicinity of an arm 44 which moves the wafer to an orienter 46, where the wafer is rotated to a particular crystal orientation. The arm 44 retrieves the oriented wafer and moves it into a loading station 48 adjacent the chamber 32. The loading station 48 closes, is pumped down to a desired vacuum, and then opens into the chamber 32. The arm 34 grasps the wafer, brings it within the chamber and places it on the support 38 in position for further handling and implantation as will be described in further detail below.

On the unload side of the chamber 32 the second arm 36 grasps an implanted wafer 29 from the support 38 and moves it from the chamber to an unload station 49. From the unload station an arm 50 moves the wafer to a shuttle 52 which automatically places the wafer into a second cassette 54.

Figure 2:
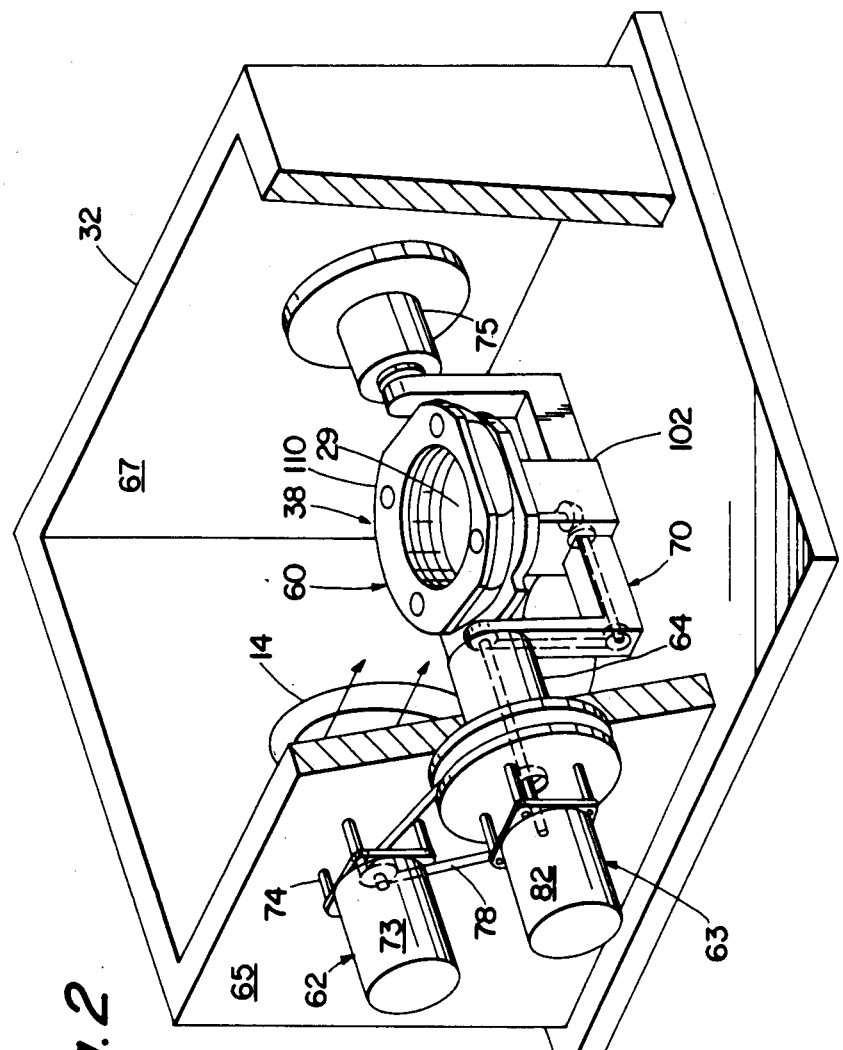
FIG. 2 is a schematic oblique view of the invention.
Figure 3:
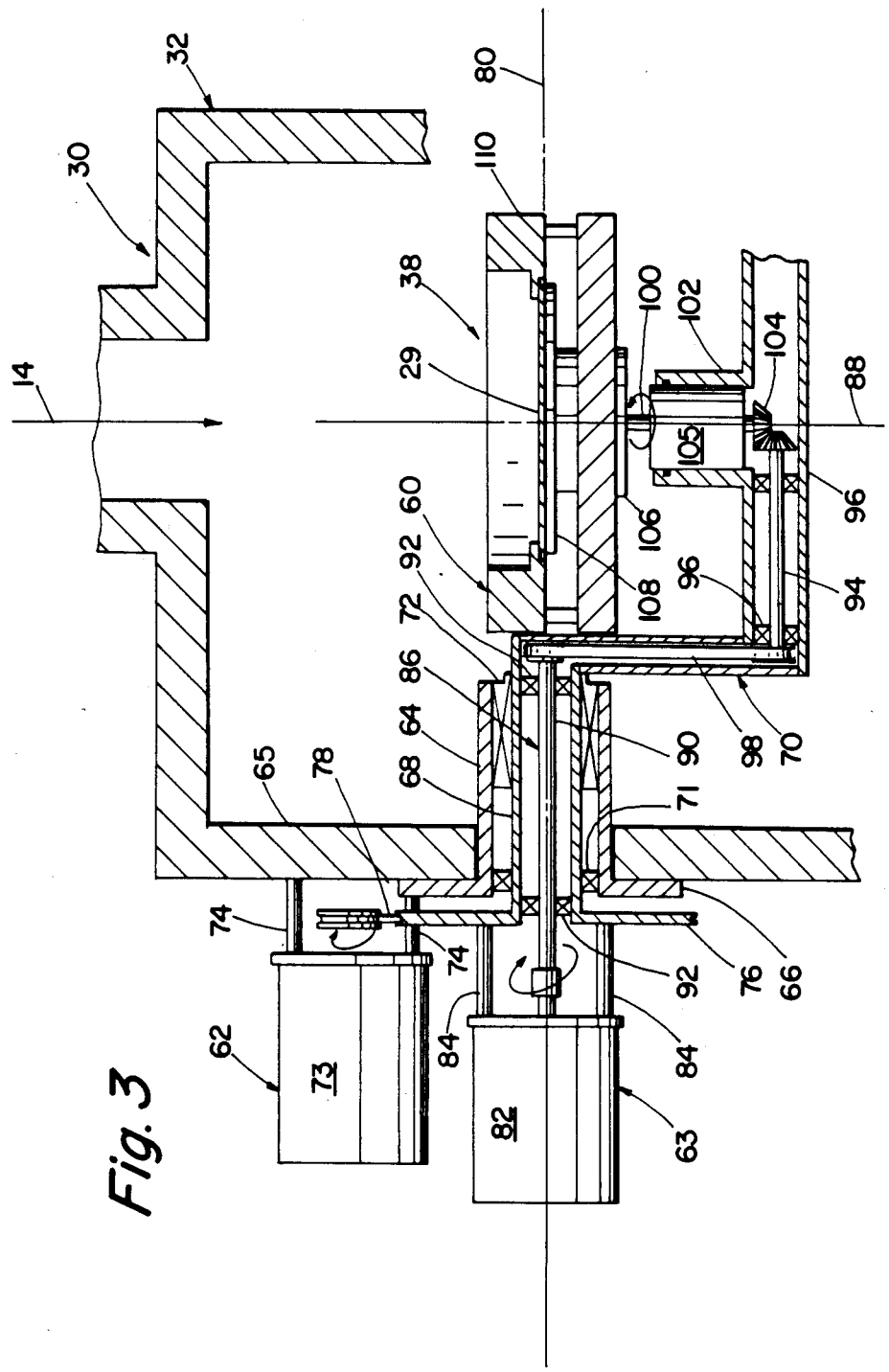
FIG. 3 is a schematic section view of the invention.

Referring particularly to FIGS. 2 and 3, the improved end station of the present invention includes a rotating and tilting wafer support assembly 38 located within the vacuum chamber 32, a wafer tilt drive assembly 62 located outside the vacuum chamber, and a wafer rotation drive system 63, also located outside the vacuum chamber.

The wafer support assembly 38 comprises a first cylindrical housing 64 which protrudes through a wall 65 of the vacuum chamber and is fixed thereto by means of a flange 66, a second cylindrical housing 68 supported for rotation within the first housing and including a generally U-shaped portion 70, and a platen assembly 60 mounted on the U-shaped portion. The housing 68 is supported by a first bearing 71 and by a combined bearing and seal assembly 72 which is preferably of a type known as a Ferrofluidic (registered trademark of Ferrofluidics Corp.) seal and bearing. Referring to FIG. 2, the U-shaped portion is further supported by a bearing assembly 75 attached to an opposite wall 67 of the vacuum chamber.

The tilt drive assembly 62 comprises a first stepper motor 73 which is mounted on the chamber 32 by means of stand-offs 74, and an enlarged drive sheave 76 which is formed as an extension of the inner cylindrical housing 68. The motor 73 is operable, though a drive belt 78, to rotate the housing and thus the platen assembly 60 about an axis 80 which extends substantially through the plane defined by the flat surface of a wafer 29 on the support.

The rotation drive system 63 comprises a second stepper motor 82 operatively mounted on the housing 68, and a transfer system 86 which is operable to rotate the platen assembly about an axis 88 through the center of the wafer 29 and normal to the axis 80. In the illustrative embodiment the motor 82 is mounted directly on the sheave 76 by means of stand-offs 84.

The transfer system 86 comprises a first shaft 90 coupled to the output shaft of the motor 82 and supported within the housing 68 on bearings 92, a second shaft 94 received within the base of the U-shaped portion 70 and supported on bearings 96, a sheave and belt system 98 connecting the first and second shafts, a third shaft 100 fixed to the platen assembly 60 and mounted for rotation within a hub 102 extending inwardly from the base of the U-shaped portion, and a bevel gear system 104 connecting the second and third shafts. The shaft 100 is supported within the hub by a combined bearing and seal assembly 105 which is also a Ferrofluidic type bearing and seal.

Referring particularly to FIG. 3 it can be appreciated that the axis of rotation of the platen assembly in the tilt mode is in the plane defined by the wafer surface, and in the rotation mode goes through the center of the wafer so that there is no vertical or horizontal translation of the wafer with respect to the beam 14, and that the tilt and rotation drive systems are independent of one another.

The platen assembly 60 comprises a base member 106 fixed to the shaft 100, a wafer-receiving platen 108 mounted on the base, and a spring-loaded clamp assembly 110 mounted on the base and operable to selectively hold the wafer in contact with the platen. Such platens and clamp assemblies are well known in the art and will not be described herein in detail. If the system is used without gas-assisted cooling, the orientation of the tilt and rotation axis also makes it possible to eliminate positive clamping of the wafer since there will be no forces present tending to cause the wafer to lift off the platen in either mode of movement.

In operation, a wafer 29 is removed from cassette 40 by the shuttle 42, moved first to the orienter 46 and then to the loading station 48 by arm 44. After proper evacuation procedures between the load station 48 and the vacuum chamber 32, the load arm 34 transfers the wafer from the load station to the platen assembly 60 where it is clamped to the platen 108 by the clamp assembly 110. The tilt drive motor 73 is then energized to rotate the wafer support about axis 80 from the horizontal position shown in FIG. 2 to an implant position, typically between 0° and 60° between the beam and a line normal to the wafer surface. Once in the desired implant position, the wafer 29 can be irradiated by the beam 14 in any fixed angular position, it can be rotated continuously, or it can be rotated in discrete steps, depending on the requirements of the particular implant.

Upon completion of the implantation the wafer is transferred first to the unload station 49 by the arm 36, and then to the cassette 54 by the arm 50 and the shuttle 52.

I claim:

1. In an ion implanter comprising a vacuum chamber; a wafer support assembly within said vacuum chamber, said wafer support assembly including a wafer receiving platen; means for directing an ion beam onto a wafer on said platen; means mounting said platen for rotation about a first axis substantially perpendicular to the beam and extending substantially through a plane defined by the surface of the wafer and about a second axis normal to the plane defined by the wafer surface, wherein both axes pass through the center of the wafer face; first drive means to rotate said platen about said first axis; and second drive means to rotate said platen about said second axis; the improvement wherein each of said first and second drive means is mounted outside said vacuum chamber.

2. Apparatus as claimed in claim 1, in which said first and second drive means are independent of one another.

3. Apparatus as claimed in claim 1, in which said wafer support assembly comprises a housing mounted for rotation about said first axis, and said platen mounted on said housing for rotation about said second axis and in position to place the plane defined by the free surface of a wafer received on said platen substantially on said first axis.

4. Apparatus as claimed in claim 3, in which said first drive means comprises a first rotary drive motor having an output member operatively connected to said housing.

5. Apparatus as claimed in claim 4, in which said first rotary drive motor is a stepper motor.

6. Apparatus as claimed in claim 3, in which said second drive means comprises rotary drive means having an output shaft mounted for rotation about said first axis, and drive transfer means operatively connecting said output shaft to said platen.

7. Apparatus as claimed in claim 6, in which said second drive means comprises a second rotary drive motor having an output operatively connected to said output shaft.

8. Apparatus as claimed in claim 7 in which said second rotary drive motor is mounted on said first housing.

9. Apparatus as claimed in claim 8, in which said second rotary drive motor is a stepper motor.

10. As claimed in claim 1, in which said wafer support assembly comprises a first hub received through a wall of said vacuum chamber, a housing partially received within said first hub and rotating about said first axis, a second hub extending from said housing perpendicular to said first axis, means mounting said platen for rotation within said second hub about said second axis; said first drive means comprises a first rotary motor having an output operatively connected to said housing; and said second drive means comprises a first drive shaft mounted within said housing for rotation about said first axis, drive transfer means within said housing and operatively connecting said drive shaft to said platen, and a second rotary motor having an output operatively connected to said first drive shaft.

11. Apparatus as claimed in claim 10, in which said first and second rotary drive motors are stepper motors.

12. Apparatus as claimed in claim 10, in which said housing comprises a first cylindrical housing element supported on bearings within said first hub, a second housing element defining a hollow U-shaped structure fixed to the first housing element and arranged such that the legs of said U-shaped structure are perpendicular to said first housing element and the base of said U-shaped structure is parallel to said first housing element, said second hub extends from said base; said first drive shaft is received within said first housing element; and said drive transfer means comprises a second drive shaft supported for rotation within the base of said U-shaped structure, endless belt means connecting said first and second drive shafts, a third drive shaft fixed to said platen and mounted for rotation within said second hub, and bevel gear means connecting said second and third drive shafts.

* * * * *